(12) United States Patent  
Nozawa

(10) Patent No.: US 11,449,043 B2
(45) Date of Patent: Sep. 20, 2022

(54) MOUNTING SYSTEM AND REPORTING CONTROL DEVICE

(71) Applicant: FUJI CORPORATION, Chiryu (JP)

(72) Inventor: Mizuho Nozawa, Kota-cho (JP)

(73) Assignee: FUJI CORPORATION, Chiryu (JP)

( * ) Notice: Subject to any disclaimer, the term of this patent is extended or adjusted under 35 U.S.C. 154(b) by 552 days.

(21) Appl. No.: 16/497,702

(22) PCT Filed: Mar. 30, 2017

(86) PCT No.: PCT/JP2017/013339
§ 371 (c)(1),
(2) Date: Sep. 25, 2019

(87) PCT Pub. No.: WO2018/179257
PCT Pub. Date: Oct. 4, 2018

(65) Prior Publication Data
US 2020/0103880 A1    Apr. 2, 2020

(51) Int. Cl.
| G05B 19/418 | (2006.01) |
| H05K 13/08 | (2006.01) |
| B25J 9/16 | (2006.01) |
| B25J 19/06 | (2006.01) |
| H05K 13/02 | (2006.01) |

(52) U.S. Cl.
CPC ...... G05B 19/41895 (2013.01); B25J 9/1676 (2013.01); B25J 19/061 (2013.01); H05K 13/021 (2013.01); H05K 13/086 (2018.08); G05B 2219/31005 (2013.01); G05B 2219/50393 (2013.01)

(58) Field of Classification Search
None
See application file for complete search history.

(56) References Cited

U.S. PATENT DOCUMENTS

| 10,618,172 B1 * | 4/2020 | Diankov ................ B25J 9/1687 |
| 2013/0085625 A1 | 4/2013 | Wolfe et al. |
| 2015/0039157 A1 | 2/2015 | Wolfe et al. |
| 2018/0242485 A1 | 8/2018 | Kondo et al. |

FOREIGN PATENT DOCUMENTS

| EP | 2 874 481 A1 | 5/2015 |
| JP | 2008-210467 A | 12/2008 |
| JP | 2014-533393 A | 12/2014 |
| JP | WO 2016/151724 A1 | 9/2016 |
| WO | WO 2014/010084 A1 | 1/2014 |
| WO | WO 2017/033268 A1 | 3/2017 |

OTHER PUBLICATIONS

International Search Report dated Jun. 20, 2017 in PCT/JP2017/013339 filed Mar. 20, 2017.

* cited by examiner

*Primary Examiner* — Sean Shechtman
(74) *Attorney, Agent, or Firm* — Oblon, McClelland, Maier & Neustadt, L.L.P.

(57) ABSTRACT

A mounting system of the present disclosure includes a mounting line having multiple mounting machines aligned side by side in a predetermined arrangement and configured to mount a component on a board, a supply device configured to convey members for use in the mounting machines and supply the members to the mounting machines by traveling in the arrangement direction, and a reporting section configured to issue a warning when the members are not supplied to the mounting machines by the supply device.

8 Claims, 6 Drawing Sheets

MOUNTING SYSTEM AND REPORTING CONTROL DEVICE

TECHNICAL FIELD

The present disclosure relates to a mounting system and a reporting control device.

BACKGROUND ART

Conventionally, as a mounting system, there has been known a mounting system including a mounting line in which multiple mounting machines for mounting components on a board are aligned side by side and an unmanned conveyance vehicle for replenishing the mounting machines with members (for example, Patent Literature 1). In the mounting system described in Patent Literature 1, the unmanned conveyance vehicle includes a monitoring section configured to detect an obstacle in a monitoring region and stops running when an obstacle is detected by the monitoring section.

PATENT LITERATURE

Patent Literature 1: WO 2016/151724

BRIEF SUMMARY

Technical Problem

Incidentally, in a mounting system having a supply device like the unmanned conveyance vehicle described above, when the supply device stops, there may occur a case where the mounting line has to stop until members that are to be conveyed by the supply device are supplied to the mounting machines, leading to a reduction in the operating rate of the mounting line. Patent Literature 1 does not take the decrease in the operating rate of the mounting line associated with the halt of the supply device into consideration.

The present disclosure has been made in order to solve the problem described above, and a main object thereof is to prevent a reduction in the operating rate of a mounting line.

Solution to Problem

The present disclosure employs the following means in order to achieve the main object described above.

There is provided a mounting system including:
a mounting line including multiple mounting machines for mounting a component on a board that are aligned side by side in a predetermined arrangement direction;
a supply device configured to move in the arrangement direction to convey members for use in the mounting machines and supply the mounting machines with the members; and
a reporting section configured to issue a warning when the members are not supplied to the mounting machines by the supply device.

In this mounting system, when the members are not supplied to the mounting machines by the supply device, the reporting section issues a warning. As a result, in this mounting system, the operator can be prompted to take an appropriate action such as removing the cause of the members not being conveyed (for example, an obstacle that would interrupt the operation of the supply device). Therefore, with this mounting system, the problematic state where the members are not supplied to the mounting machines is easily solved in an early stage, thereby making it possible to prevent a reduction in the operating rate of the mounting line.

A reporting control device of the present disclosure is a reporting control device for use in a mounting system including:
a mounting line including multiple mounting machines for mounting a component on a board that are aligned side by side in a predetermined arrangement direction,
a supply device configured to move in the arrangement direction to convey members for use in the mounting machines and supply the mounting machines with the members, and
a reporting section configured to issue a warning when the members are not supplied to the mounting machines by the supply device; the reporting control device including:
a reporting control section configured to perform a determination process of determining whether the members are supplied to the mounting machines by the supply device and cause the reporting section to issue a warning when a determination is made through the determination process that the members are not being supplied to the mounting machines by the supply device.

In this reporting control device, when the reporting control section determines that the members are not being supplied to the mounting machines by the supply device, the reporting section issues the warning. As a result, with this reporting control device, the operator can be urged to take an appropriate action such as an action to remove the cause of the non-conveyance of the members (for example, an obstacle that would interrupt the operation of the supply device). Therefore, with the mounting system including this reporting control device, the problematic state where the members are not supplied to the mounting machines is easily solved in an early stage, thereby making it possible to prevent a reduction in the operating rate of the mounting line.

DESCRIPTION OF EMBODIMENTS

Figure 1:
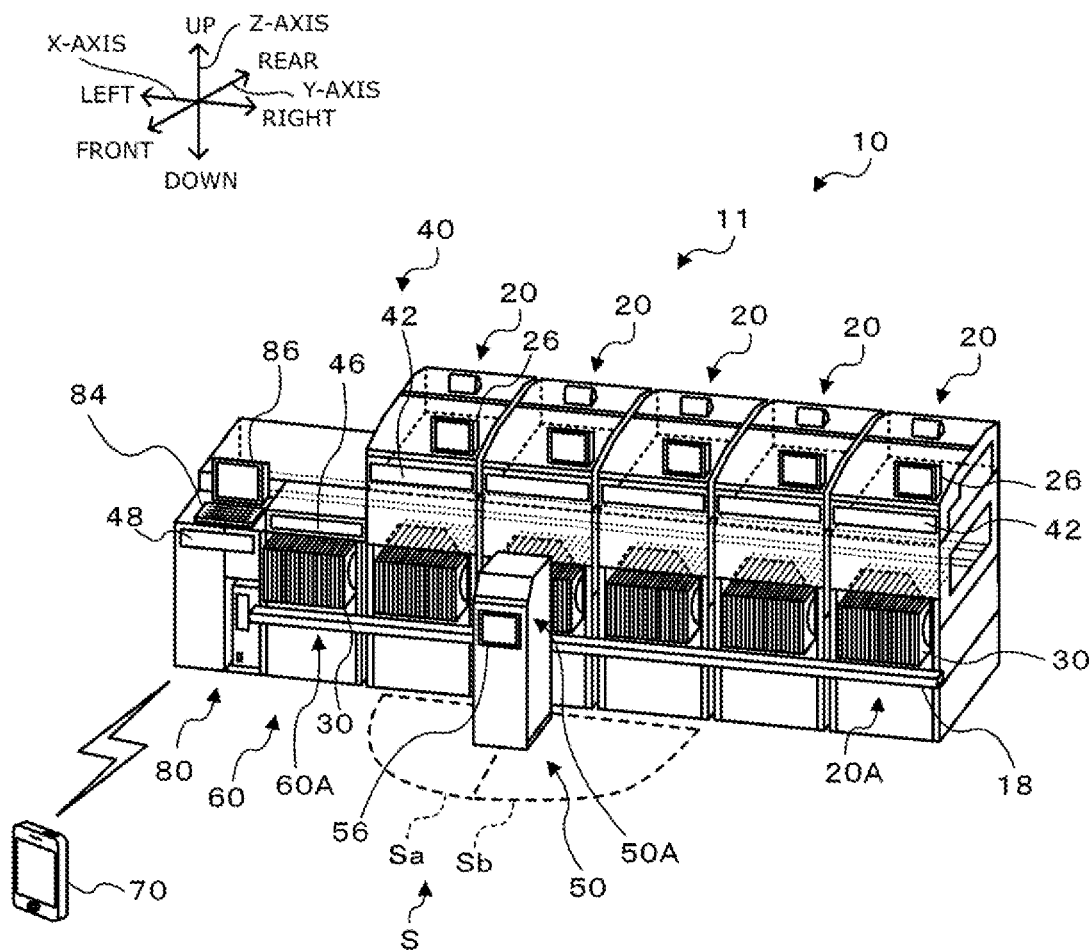
FIG. 1 is a diagram showing a schematic configuration of mounting system 10.
Figure 2:
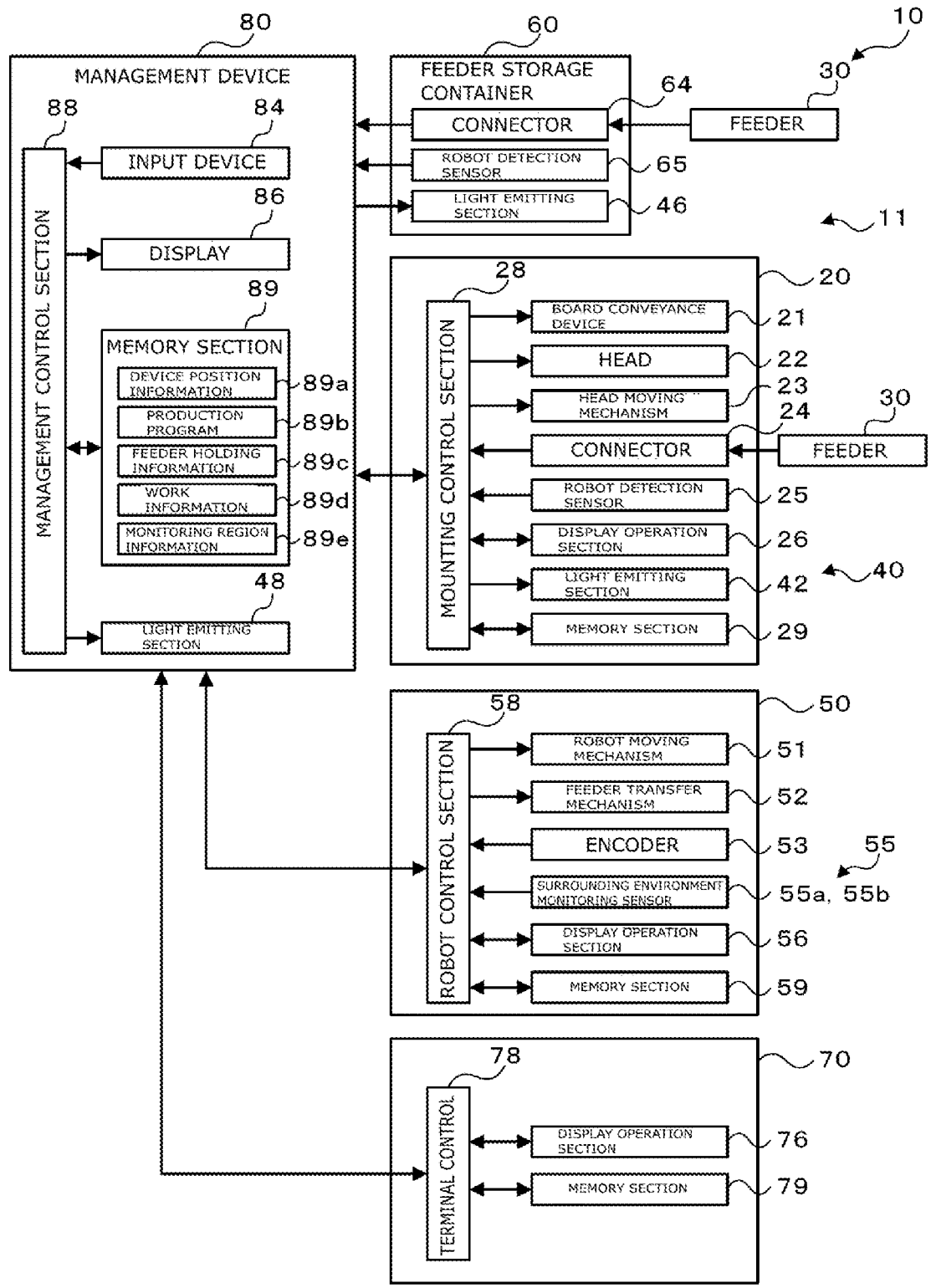
FIG. 2 is a block diagram relating to the control of mounting system 10.

Embodiments of a mounting system of the present disclosure will be described below while referring to drawings. FIG. 1 is a diagram showing a schematic configuration of mounting system 10, and FIG. 2 is a block diagram relating to the control of mounting system 10. In FIG. 1, the left-right direction is the X-direction, the front-rear direction is the Y-direction, and the up-down direction is the Z-direction.

As shown in FIG. 1, mounting system 10 includes mounting line 11 having multiple devices including mounting machines 20. Mounting line 11 includes multiple (five, in the present embodiment) mounting machines 20 for mounting components supplied from feeders 30 on a board, feeder storage container 60 configured to store multiple feeders 30, mobile terminal 70 held by an operator or the like, and management device 80 configured to manage the whole of mounting system 10. In mounting line 11, management device 80, feeder storage container 60, and multiple mounting machines 20 are aligned in this order in a predetermined arrangement direction (here, in the X-direction, that is, in the left-right direction). The arrangement direction is parallel to a conveyance direction (the X-direction) of boards in mounting line 11. In the X-direction (the left-right direction), the left side constitutes the upstream side of the conveyance direction, and a right side constitutes the downstream side of the conveyance direction. Supply and collection of feeders 30 to and from feeder storage container 60 and mounting machines 20 are also referred to as loading and unloading of feeders 30 in and from feeder storage container 60 and mounting machines 20.

Mounting system 10 includes mobile robot 50 configured to automatically load and unload feeders 30 between each of multiple mounting machines 20 and feeder storage container 60 and itself. Mobile robot 50 is an example of a supply device and is movable along X-axis rail 18 provided on the front faces of multiple mounting machines 20 and the front face of feeder storage container 60 in parallel to the board conveyance direction (X-direction).

As shown in FIG. 2, mounting machine 20 includes board conveyance device 21, head 22, head moving mechanism 23, multiple connectors 24, robot detection sensor 25, display operation section 26, light emitting section 42, mounting control section 28, and memory section 29. Board conveyance device 21 conveys a board in the X-direction. Head 22 has a suction nozzle configured to pick up a component supplied by feeder 30. Head moving mechanism 23 includes, for example, a slider and a motor, and moves head 22 in the X and Y directions. Multiple connectors 24 are configured in such a manner that corresponding feeders 30 can be mounted individually to connectors 24, and each connector 24 connects a feeder control section of feeder 30 so mounted with mounting control section 28 in a communicable manner. As shown in FIG. 1, mounting machine 20 has supply area 20A at the front thereof. Supply area 20A has multiple slots where feeders 30 can be mounted in such a manner as to match with multiple connectors 24. Feeders 30 loaded individually in the slots of this supply area 20A are mounted to corresponding connectors 24. Robot detection sensor 25 is a sensor configured to detect mobile robot 50. Robot detection sensor 25 has a detection range that is defined over front regions of mounting machines 20 and detects whether mobile robot 50 is in front of mounting machines 20. Robot detection sensor 25 may be, for example, a contact type sensor disposed on the X-axis rail 18, or may be a non-contact sensor such as an infrared sensor. Display operation section 26 includes, for example, a touch panel, operation buttons, and the like, and displays various types of information for the operator and inputs therefrom various types of operations from the operator. Display operation section 26 is disposed in such a manner as to be visible from the front of mounting machine 20. Light emitting section 42 is a light source unit including multiple LEDs of three colors of red, green, and blue, and can emit light of various colors. Light emitting section 42 is disposed on the front face of mounting machine 20. Mounting control section 28 includes CPU, ROM, RAM, and the like, and controls the whole of mounting machine 20. Memory section 29 is a nonvolatile memory such as HDD and stores various types of information. Mounting control section 28 outputs drive signals to board conveyance device 21, head 22, and head moving mechanism 23 outputs a display signal to display operation section 26 and outputs a light emission signal to light emitting section 42. Mounting control section 28 inputs various types of information of feeder 30 via connector 24, inputs a detection signal from robot detection sensor 25, and inputs an operation signal from display operation section 26. Mounting control section 28 exchanges information with memory section 29.

Feeder 30 is configured as a tape feeder including a tape on which multiple components are installed at a predetermined pitch. Although not shown in detail, feeder 30 includes a reel around which a tape is wound, a tape feeding mechanism configured to draw and feed the tape from the reel, a feeder control section configured to control the whole of the feeder, and a memory section. In feeder 30, the tape is fed out by the feeder control section outputting a drive signal to tape feeding mechanism 33, resulting in a state where components installed on the tape can be picked up by a suction nozzle on head 22. Memory section stores feeder information, such as ID information of feeder 30, and the type and number of components installed in feeder 30. When feeder 30 is mounted to connector 24 or connector 64, the feeder control section can communicate with a control section of the mounting destination (mounting control section 28 or management control section 88) via connector 24 or 64.

Mobile robot 50 is a device for conveying feeders 30 for use in mounting machines 20. Mobile robot 50 includes robot moving mechanism 51, feeder transfer mechanism 52, encoder 53, surrounding environment monitoring sensor 55, display operation section 56, robot control section 58, and memory section 59. Robot transfer area 50A configured to accommodate multiple feeders 30 is provided in the interior of a housing of mobile robot 50. Robot transfer area 50A has multiple slots where feeders 30 can be accommodated individually. Robot moving mechanism 51 includes, for example, a drive belt, a servomotor configured to drive the drive belt, and the like, and moves mobile robot 50 in the X-direction along X-axis rail 18 shown in FIG. 1. Feeder transfer mechanism 52 is a mechanism for moving feeder 30 back and forth, and includes, for example, a clamp section for clamping feeder 30, a Y-axis motor for moving the clamp section in the Y-direction, a Y-axis slider, and the like. Feeder transfer mechanism 52 conveys feeders 30 accommodated in robot transfer area 50A forward into supply area 20A of mounting machine 20 or storage area 60A of feeder storage container 60. In addition, feeder transfer mechanism 52 conveys feeders 30 mounted in supply area 20A of mounting machine 20 or storage area 60A of feeder storage container 60 backward and accommodates feeders 30 in robot transfer area 50A. Encoder 53 detects a movement position in the X-direction by robot moving mechanism 51. Surrounding environment monitoring sensor 55 is a sensor for monitoring the presence of an obstacle (including the operator) in the surrounding environment, and the detection range (the monitoring range) is within monitoring region S shown in FIG. 1. Surrounding environment monitoring sensor 55 includes left-side monitoring sensor 55a configured to monitor the left side (within left-side monitoring region Sa shown in FIG. 1) of monitoring region S, and right-side monitoring sensor 55b configured to monitor the right side (within right-side monitoring region Sb shown in FIG. 1) of monitoring region S. Left-side monitoring sensor 55a and right-side monitoring sensor 55b are, for example, infrared sensors. As shown in FIG. 1, the range of monitoring region S is set to such that, with mobile robot 50 located directly in front of mounting machine 20, monitoring region S includes the regions directly in front of mounting machines 20 directly adjacent to the left and right of mounting machine 20 in question but does not include regions directly in front of mounting machines 20 located one mounting machine 20 further to the left and right. Display operation section 56 includes, for example, a touch panel, an operation button, and the like, and various types of information for the operator is displayed thereon, while various types of operations are inputted therefrom by the operator. Display operation section 56 is disposed on the front side of mobile robot 50 so as to be visible from the front of mobile robot 50. Robot control section 58 includes CPU, ROM, RAM, and the like and controls the whole of mobile robot 50. Memory section 59 is a nonvolatile memory such as HDD and stores various types of information. Robot control section 58 outputs drive signals to robot moving mechanism 51 and feeder transfer mechanism 52 and outputs a display signal to display operation section 56. Robot control section 58 receives a detection signal from encoder 53 to detect the current position of mobile robot 50 in the X-direction, receives a detection signal from surrounding environment monitoring sensor 55, and receives an operation signal from display operation unit 56. Robot control section 58 exchanges information with memory section 59.

As shown in FIG. 1, feeder storage container 60 has storage area 60A in the front-side area in the housing thereof. Storage area 60 A has multiple slots in which feeders 30 can be attached individually. Storage area 60A is provided at the same height (position in the Z-direction) as supply area 20A of mounting machine 20. As a result, mobile robot 50 can attach and detach feeders 30 to and from storage area 60A of feeder storage container 60 by the same operation as an operation performed in attaching and detaching feeders 30 to and from supply area 20A of mounting machine 20. In storage area 60A, connectors 64 similar to connectors 24 are disposed in such a manner as to correspond individually to the multiple slots. Feeders 30 loaded into storage area 60A are individually mounted in corresponding connectors 64 (refer to FIG. 2). Storage area 60A accommodates both feeders 30 that are to be used in mounting machines 20 and feeders 30 that have been used in mounting machines 20. As shown in FIG. 2, feeder storage container 60 includes robot detection sensor 65 and light emitting section 46, which are similar to robot detection sensor 25 and light emitting section 42. Robot detection sensor 65 has a detection range that is defined over a front region of feeder storage container 60 and detects whether mobile robot 50 is in front of mounting feeder storage container 60. Light emitting section 42 is disposed on the front face of the housing of feeder storage container 60. The supply of feeders 30 to storage area 60A and the collection of used feeders 30 from storage area 60A are performed by the operator in this embodiment. However, for example, an unmanned conveyance vehicle (AGV), not shown, may supply, collect, and convey feeders 30 in place of the operator.

Mobile terminal 70 includes display operation section 76, terminal control section 78, and a memory section 79. Display operation section 76 includes, for example, a touch panel, an operation button, and the like, and various types of information for the operator is displayed thereon, while various types of operations are inputted therefrom by the operator. Terminal control section 78 includes CPU, ROM, RAM, and the like, and controls the whole of mobile terminal 70. Terminal control section 78 exchanges various types of information and signals with display operation section 76 and memory section 79. Memory section 79 is a nonvolatile memory such as a flash memory and stores various types of information.

As shown in FIG. 1, management device 80 includes input device 84 such as a keyboard or a mouse, display 86 such as LCD, and light emitting section 48. Light emitting section 48 is a light source unit similar to light emitting section 42 and light emitting section 46, and is disposed on the front face of the housing of management device 80. Light emitting section 42, light emitting section 46, and light emitting section 48 are collectively referred to as light emitting section 40. As shown in FIG. 2, management device 80 includes management control section 88 and memory section 89.

Management control section 88 includes CPU, ROM, RAM, and the like and controls the whole of management device 80, as well as the whole of mounting system 10. Memory section 89 is a nonvolatile memory such as HDD, and stores various types of information. Management control section 88 receives an inputted instruction from the operator via input device 84, outputs a display signal to display 86, and outputs a light emission signal to light emitting section 48. Management control section 88 receives inputted various types of information on feeders 30 mounted in storage area 60A via connectors 64 by wire, receives an inputted detection signal from robot detection sensor 65, and outputs a light emission signal to light emitting section 46. Management control section 88 exchanges information with memory section 89. In addition, management control section 88 is connected to mounting control section 28 by a wire in a communicable manner, wirelessly connected to robot control section 58 and mobile terminal 70 in a communicable manner, and outputs various control signals to these control sections. Management control section 88 receives information on the mounting status of mounting machine 20 from mounting control section 28, receives information on the driving status of mobile robot 50 from robot control section 58, and receives various types of information from mobile terminal 70

As shown in FIG. 2, memory section 89 stores device position information 89a, a production program 89b, feeder holding information 89c, work information 89d, and monitoring region information 89e. Device position information 89a is information that can specify positions of individual devices (here, mounting machine 20, feeder storage container 60, and management device 80) that make up mounting line 11. Device position information 89a is, for example, information in which identification information and positional information of each device are associated with each other. The positional information may be, for example, numbers assigned from the upstream side to the downstream side in the X-direction, or may be an X-coordinate. In the present embodiment, one light emitting section 40 is disposed on each device constituting mounting line 11, and management control section 88 can specify the position of each of multiple light emitting sections 40 (here, the position in the X-direction) based on device position information 89a. That is, device position information 89a doubles as information that can specify the position of each of multiple light emitting sections 40. Production program 89b is a program for determining which component is to be mounted on which board by which mounting machine 20, how many boards on which components are so mounted are to be produced, and the like.

Feeder holding information 89c is information on feeders 30 that is set in each area of supply areas 20A, robot transfer area 50A, and storage area 60A. Feeder holding information

89c is, for example, information in which area identification information for identifying each of the areas, slot numbers representing positions of feeder 30 in the area, and feeder information of feeder 30 (ID information and information on the type and number of components) are associated with each other. Based on this feeder holding information 89c, management control section 88 can specify what type of feeder 30 is mounted in which position (slot) of each area, which slot of each area is empty (state in which no feeder 30 is mounted), and the like. Feeder holding information 89c is updated to the latest state according to attachment and detachment of feeder 30 into and from each area. For example, when feeder 30 is mounted in either connector 24 or connector 64, the control section at the mounting destination where feeder 30 in question is mounted (mounting control section 28 or management control section 88) acquires feeder information from feeder 30 in question, and management control section 88 updates feeder holding information 89c regarding supply area 20A and storage area 60A. In addition, since management control section 88 has information on the area where mobile robot 50 loads or unloads feeders 30, or feeders 30 to be loaded or unloaded next, management control section 88 updates feeder holding information 89c regarding robot transfer area 50A based on the information. For example, when feeder 30 is detached from either connector 24 or connector 64, in the case where feeder 30 in question is an unloading target of mobile robot 50, assuming that feeder 30 in question is accommodated in mobile robot 50, management control section 88 updates feeder holding information 89c regarding robot transfer area 50A. A configuration may be adopted in which mobile robot 50 includes a connector similar to connector 24, and management control section 88 updates feeder holding information 89c by also receiving inputted information on attachment/detachment of feeder 30 and information on feeder 30 from mobile robot 50. In feeder information, information on the number of components may be information that can specify whether the number of components on feeder 30 is "Full" (unused) or "Empty" (already used up in mounting machine 20) or may be a value representing the number of remaining components. In the latter case, management control section 88 acquires the number of components remaining on each feeder 30 from mounting control section 28 every predetermined cycle to update feeder holding information 89c.

Figure 3:
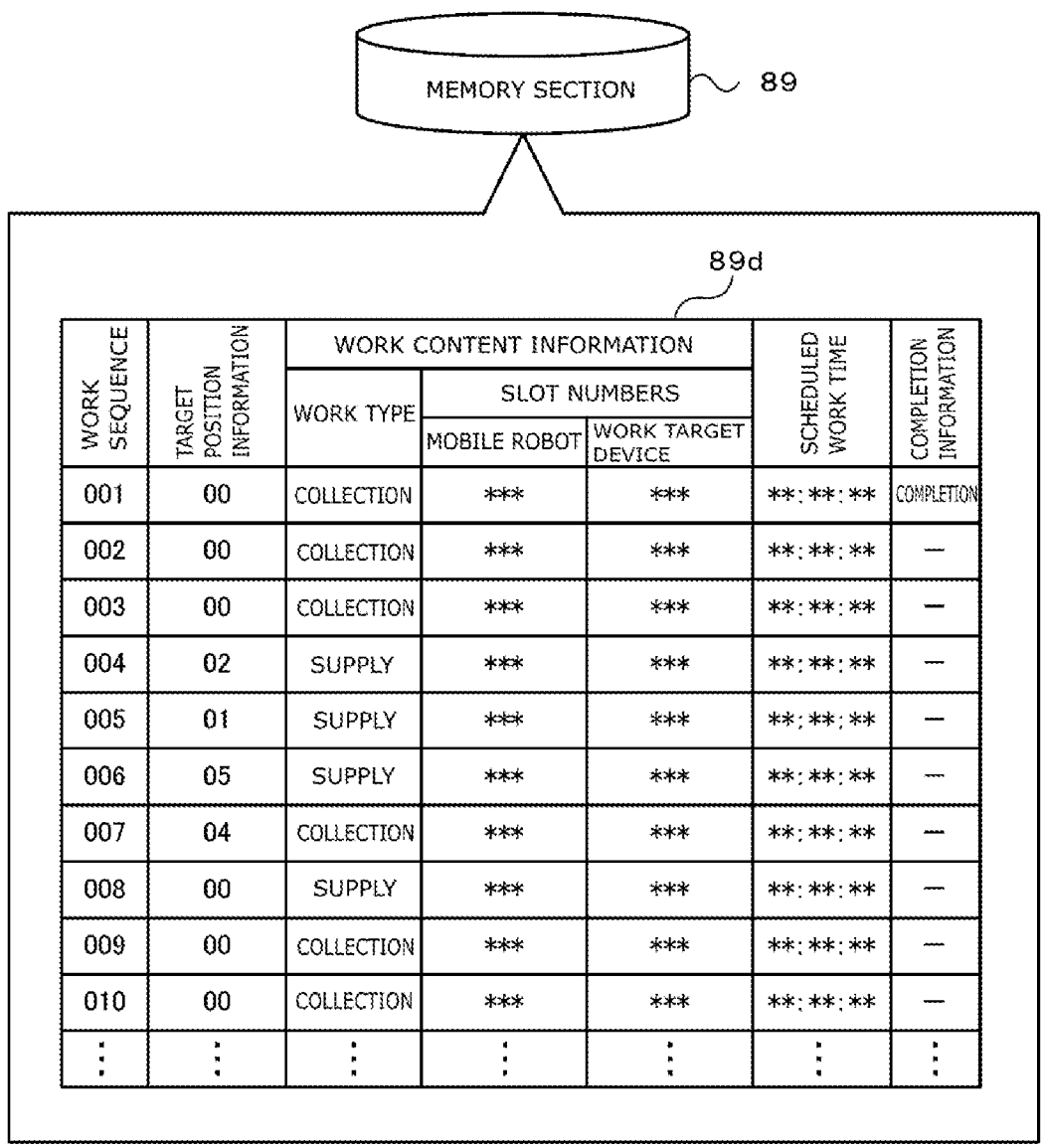
FIG. 3 is a diagram showing an example of work information 89$d$ stored in memory section 89.

Work information 89d is information on work to be performed by mobile robot 50, such as information informing to which of mounting machine 20 and feeder storage container 60 mobile robot 50 moves to load and unload feeders 30 in which sequences. FIG. 3 is a diagram showing an example of work information 89d stored in memory section 89. As shown in FIG. 3, work information 89d includes: work sequence information along which work is performed; positional information on the work target devices, on which work is performed (referred to as target position information); work content information; scheduled work time, and completion information, denoting whether work is completed, and these pieces of information are associated with one another. The target position information may be the same information as, for example, positional information of the devices included in device position information 89a. In the present embodiment, in the target position information in FIG. 3, "00" indicates the position of feeder storage container 60, and "01" to "05" indicate the positions of multiple mounting machines 20 as counted from leftmost mounting machine 20. The target position information is referred to as device identification information, and the target position information and the position information of the work target devices may be associated with each other via device position information 89a. The work content information includes, for example, a work type denoting which of supply (loading) and collection (unloading) of feeder 30 is to be performed, and information on slot numbers of the work targets. Slot numbers of the work target are slot numbers of robot transfer area 50A of mobile robot 50 and slot numbers of supply area 20A or storage area 60A of the work target device. When the work type indicates "supply", feeders 30 lying in slot number positions in mobile robot 50 are supplied to slot number positions of the work target device. When the work type indicates "collection", feeders 30 in the slot number positions in the work target device are collected back into the slot number positions in mobile robot 50. In the present embodiment, one "work" corresponding to one work sequence includes a movement of mobile robot 50 and a supply or collection of feeders 30 by mobile robot 50. For example, work corresponding to the work sequence of "004" includes a movement, that is, conveying of feeders 30 to third leftmost mounting machine 20 (target position information "03") and supplying of feeders 30 to mounting machine 20 in question. However, in the case where the work target device remains unchanged from the immediately preceding work (for example, the work in the work sequence of "002" and the work in the work sequence of "003"), mobile robot 50 may remain stationary as a result. The scheduled work time is a time by which the work specified by the corresponding work content information should be completed. The scheduled work time is determined in advance by the operator based on, for example, production program 89b so that feeders 30 installing required components are supplied from mobile robot 50 to individual mounting machines 20 before a halt of mounting line 11 is caused by a shortage of components in feeders 30. Multiple types of work included in work information 89d are normally executed according to the work sequences. Due to this, a scheduled work time corresponding to a certain work sequence is determined as a time at or by which any work corresponding to a subsequent work sequence can be completed without stopping mounting line 11. In other words, regardless of whether work corresponding to a certain work sequence is a supplying of feeders 30 to mounting machine 20, in the event that work is not completed by the scheduled work time, mounting line 11 is stopped afterwards without managing to supply feeders 30 to any one of mounting machines 20. In the present embodiment, the scheduled work time is a time based on the operation starting time of mounting line 11, that is, an elapsed time from the operation starting time. In the completion information in FIG. 3, "completion" means that the corresponding work is completed, and "–" means that the corresponding work has not yet been completed. When the supply of feeders 30 to mounting machines 20 is delayed due to, for example, an operation stop of mobile robot 50, management control section 88 may change work information 89d based on projection program 89b and feeder holding information 89c so as to shorten the period of time when mounting line 11 is halted, due to a shortage of components, as much as possible. Monitoring region information 89e is information that can specify monitoring region S of surrounding environment monitoring sensor 55 of mobile robot 50. Feeder holding information 89c includes, for example, information indicating a relative position of surrounding environment monitoring sensor 55 with respect to the position of mobile robot 50. In the present embodiment, monitoring region information 89e includes information informing that mounting machines 20 to the left and right of mobile robot 50 with reference to the current position of mobile robot 50 are included in monitoring region S. Monitoring region information 89e may include information representing monitoring region S using relative XY coordinates with reference to mobile robot 50 as an origin.

Figure 4:
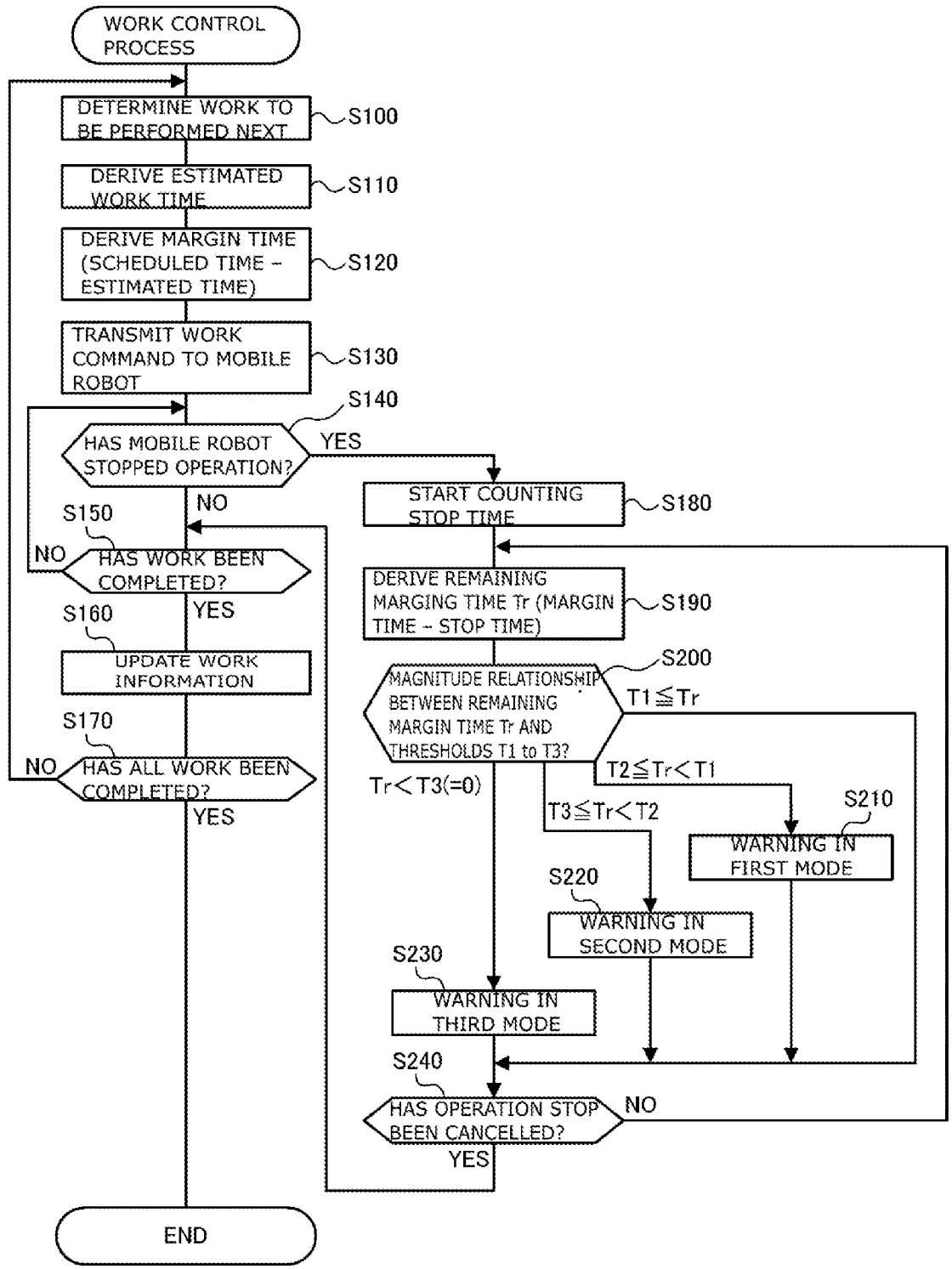
FIG. 4 is a flow chart of a work control process.

Next, the operation of mounting system 10 configured as described above will be described in relation particularly to controlling mobile robot 50 and issuing a warning in the case where no feeder 30 is supplied to mounting machine 20 by mobile robot 50, both being executed by management control section 88. FIG. 4 is a flow chart showing an example of a work control process. For example, when an operation start instruction of starting an operation of mounting line 11 is input from the operator via input device 84, management control section 88 causes multiple mounting machines 20 of mounting line 11 to start mounting components on boards and starts this work control process. When the work control process is started, management control section 88 first sets the work that mobile robot 50 performs next based on operation data 89d (step S100). Management control section 88 specifies, for example, the work information set first in order among incomplete works of which information is stored in work information 89d, and sets the work as work that mobile robot 50 performs next.

Following this, management control section 88 derives an estimated work time of the work so set (step S110). The estimated work time is derived based on, for example, a traveling time of mobile robot 50 required from a present point in time to a completion of the work and a loading and unloading time of feeders 30. Management control section 88 derives a traveling time of mobile robot 50 based, for example, on the current position of mobile robot 50 and the work target position information set in step S100. The current position of mobile robot 50 is derived based, for example, on detection signals of robot detection sensors 25, 65 that management control section 88 inputs from mounting control section 28 and robot detection sensor 65. Management control section 88 may acquire the current position of mobile robot 50 based on encoder 53 from robot control section 58. With respect to loading and unloading times of feeders 30, in the present embodiment, a time required for each type of work such as, for example, a time required to supply one feeder 30 or a time required to collect one feeder 30 is stored in advance in memory section 89. Then, management control section 88 acquires loading and unloading times of feeders 30 based on the work type of work set in step S100 and times for the types of work stored in memory section 89. Management control section 88 may derive loading and unloading times of feeders 30 by additionally taking, for example, the slot numbers contained in the work content information into consideration.

After the estimated work time is derived, management control section 88 acquires the scheduled work time of the work set in step S100 from memory section 89 and derives the difference between the scheduled work time and the estimated work time as a margin time (step S120). Then, management control section 88 transmits a work command to mobile robot 50 to cause mobile robot 50 to start the work set in step S100 (step S130). The work command includes, for example, target position information and work content information on the work set in step S100.

Robot control section 58 of mobile robot 50 that has received the work command executes the work based on the received work command. At this time, when an obstacle is detected in monitoring region S based on a detection signal from surrounding environment monitoring sensor 55, robot control section 58 stops the operation of mobile robot 50 (here, moving and loading/unloading of feeders 30), and transmits an operation stop signal to management control section 88. Thereafter, when no obstacle is detected in monitoring region S, robot control section 58 cancels the operation stop and continues the operation, and transmits an operation stop cancellation signal to management control section 88. When the work is completed, robot control section 58 transmits a work completion signal to management control section 88.

When transmitting the work command in step S130, management control section 88 determines whether mobile robot 50 stops operation based on whether the operation stop signal described above is received (step S140). If mobile robot 50 does not stop operation, management control section 88 determines whether mobile robot 50 completes the work based on whether the work completion signal described above is received (step S150). If the operation has not been completed, management control section 88 executes the processes from step S140 on. That is, management control section 88 waits for either the operation stop or the work completion of mobile robot 50 to occur. If it is determined in step S150 that the work has been completed, management control section 88 updates the completion information of the work set in step S100 in work information 89d from the information indicating incompletion to the information indicating completion (step S160). Subsequently, management control section 88 determines whether all the work included in work information 89d has been completed (step S170), and if there remains incomplete work, management control section 88 executes the processes from step S100 on. On the other hand, if it is determined that all the work has been completed, management control section 88 ends the present routine.

In this way, when no operation stop occurs on mobile robot 50, management control section 88 repeats steps S100 to S170 and causes mobile robot 50 to sequentially execute the work included in work information 89d. As a result, mobile robot 50 performs work such as collection work of collecting unused feeders 30 stored in feeder storage container 60, supplying work of conveying unused feeders 30 to mounting machines 20 to supply unused feeders 30 in question to mounting machines 20 in question, collection work of collecting used feeders 30 from mounting machines 20, and supplying work of conveying used feeders 30 to feeder storage container 60 to supply used feeders 30 in question to feeder storage container 60 in accordance with the work sequence stored in work information 89d. When acquiring information on feeders 30 newly supplied or collected via, for example, connectors 24 or connectors 64, management control section 88 updates feeder holding information 89c based on the acquired information.

On the other hand, if it is determined in step S140 that mobile robot 50 stops operation, management control section 88 starts timing a stop time of mobile robot 50 (step S180) and derives the difference between the margin time derived in step S120 and the timed stop time as remaining margin time Tr (step S190). This remaining margin time Tr is the remaining time for allowing the work set in step S100 to be performed at the scheduled work time. For example, when the derived remaining margin time is 15 minutes, in the event that the operation stop of mobile robot 50 is canceled within 15 minutes from the present time, the work set in step S100 can be completed before the scheduled work time or the work stop time, that is, the scheduled work time is met. In addition, the longer the timed stop time of mobile robot 50, that is, the longer the halt of mobile robot 50 continues, the shorter the value in length of remaining margin time Tr.

Subsequently, management control section 88 performs a determination process of determining the magnitude relationship between derived remaining margin time Tr and predetermined first to third thresholds T1 to T3 (step S200). First threshold value T1 is a minimum value of a value at which remaining margin time Tr can be considered to be so long that the operator does not have to be reported with a warning, and is set at 10 minutes in the present embodiment. Second threshold value T2 is a minimum value of a value at which remaining margin time Tr can be considered to be long to some extent although the operator needs to be reported with a warning, and is set at 5 minutes in the present embodiment. Third threshold T3 is a minimum value of remaining margin time Tr for the work set in step S100 to meet the scheduled work time, and takes a value of 0 in the present embodiment. If it is determined in step S200 that remaining margin time Tr is first threshold T1 or greater, management control section 88 proceeds directly to step S240, which will be described later, to perform a process therein without reporting the operator with a warning. If it is determined in step S200 that remaining margin time Tr is smaller than first threshold T1 and is second threshold T2 or greater, management control section 88 reports the operator with a warning in a first mode (step S210); if it is determined in step S200 that remaining margin time Tr is smaller than second threshold T2 and is third threshold T3 or greater, management control section 86 reports the operator with a warning in a second mode (step S220); and if it is determined in step S200 that remaining margin time Tr is smaller than third threshold T3, management control section 86 reports the operator of a warning in a third mode (step S230). Although it will be described later in detail, in the first to third modes, a mode of warning is set so that the warning to the operator tends to become stronger in this order. After determining in step S200 that remaining margin time Tr is first threshold T1 or greater, or after performing the process in any one of steps S210 to S230, management control section 88 determines whether the operation stop of mobile robot 50 has been canceled based on whether the operation stop canceling signal described above has been received (step S240). Then, if it is determined in step S240 that the operation stop of mobile robot 50 has not yet been cancelled, management control section 88 performs the processes from step S190 on. On the other hand, if it is determined in step S240 that the operation stop of mobile robot 50 has been cancelled, management control section 88 performs the processes from step S150 on.

In this way, when the operation stop of mobile robot 50 occurs, management control section 88 repeats steps S190 to S240 until it determines in step S240 that the operation stop of mobile robot 50 has been canceled. That is, management control section 88 alternately repeats the process of deriving remaining margin time Tr based on the timed stop time, and the process of reporting the operator with no warning or the process of reporting the operator with a warning in the first to third modes according to the length of remaining margin time Tr. Here, if it is determined in step S200 that remaining margin time Tr is first threshold T1 or greater, management control section 88 issues no warning even though mobile robot 50 stops operation. That is, if remaining margin time Tr is first threshold T1 or greater, management control section 88 determines that since remaining margin time Tr is long enough, a state in which feeders 30 are not supplied to mounting machines 20 does not occur (that is, a halt of mounting line 11 does not occur) and hence determines that no warning is necessary. On the other hand, if it is determined in step S200 that remaining margin time Tr falls below first threshold value T1, management control section 88 determines that no feeder 30 is supplied to mounting machines 20 due to mobile robot 50 stopping operation and issues a warning in any one of the first to third modes. Specifically, when remaining margin time Tr becomes smaller than first threshold T1, management control section 88 first issues a warning in the first mode. Then, as remaining margin time Tr gets shorter due to the continuation of the operation stop of mobile robot 50 getting longer, management control section 88 issues a warning in the second mode which is a warning stronger than the warning in the first mode, and issues a warning in the third mode which is even stronger.

In the present embodiment, the first mode is a mode in which light emitting sections 40 of the devices corresponding to the current position of mobile robot 50 and monitoring region S emit yellow light, and further, display operation sections 26 of the devices corresponding to the current position of mobile robot 50 and monitoring region S display a warning screen including remaining margin time Tr thereon. In step S210, management control section 88 derives a current position of mobile robot 50 in the same manner in which step S110 is executed, and specifies in the devices of mounting line 11 a device which faces mobile robot 50, that is, a device which is positioned directly behind mobile robot 50 based on the derived current position and device position information 89*a*. In addition, management control section 88 specifies the devices, among the devices of mounting line 11, which face monitoring region S of mobile robot 50, that is, devices which are located directly behind monitoring region S, based on the derived current position, monitoring region information 89*e*, and device position information 89*a*. Then, management control section 88 causes light emitting sections 40 and display operation section 26 of the specified devices to issue a warning in the first mode. For example, when mobile robot 50 stops operation in the state shown in FIG. 1, management control section 88 specifies the second leftmost mounting machine 20 as the device corresponding to the current position of mobile robot 50. In addition, management control section 88 specifies the second leftmost mounting machine 20 and the devices located directly on the left and right of the second leftmost mounting machine 20 as the devices corresponding to monitoring region S. In the case where the specified devices include feeder storage container 60 or management device 80, since there is no such display section as display operation section 26 on those devices, management control section 88 controls only light emitting sections 40 (light emitting section 46 or light emitting section 48). Remaining margin time Tr to be displayed on display operation section 26 by management control section 88 is, for example, the value derived in immediately preceding step S190. The warning screen displayed on display operation section 26 by management control section 88 may include not only remaining margin time Tr but also a sentence reading that mounting line 11 will stop unless an obstacle is removed before displayed remaining margin time Tr reaches the value 0.

In the present embodiment, the second mode is the same as the first mode except that light emitting sections 40 emit red light. Therefore, in step S220, management control section 88 controls light emitting sections 40 and display operation sections 26 in the same manner as in step S210 except for the control of the color of light emitted from light emitting sections 40.

In the present embodiment, the third mode is the same as the second mode except that the display operation section 26 displays a warning screen including a delay time from the scheduled work time instead of remaining margin time Tr, and that display operation section 76 of mobile terminal 70 also displays a warning screen similar to that displayed on display operation section 26. In step S230, management control section 88 controls light emitting sections 40 in the same manner as in step S210, and controls display operation sections 26 in the same manner as in step S210 except that the delay time is displayed thereon. In addition, management control section 88 transmits a control signal to mobile terminal 70, causing mobile terminal 70 to display a warning screen similar to that of display operation section 26. Terminal control section 78 of mobile terminal 70 displays a warning screen including a delay time on display operation section 76 based on the received control signal. The delay time is an alias of the margin time Tr when the value is negative (where the stop time is longer than the margin time). The delay time displayed on display operation section 26 and display operation section 76 is an absolute value in the present embodiment but may remain as a negative value. For example, a state in which an absolute value of the delay time is 30 seconds means a state in which, even though the operation stop of mobile robot 50 is canceled now, the work set in step S100 is completed 30 seconds after the scheduled work time. The absolute value of the delay time becomes larger as the continuation time of the halt of mobile robot 50 gets longer. The management control section 88 may time the time elapsed from a point in time when remaining margin time Tr reaches the value 0, and may set the counted value as a delay time.

The operator who has confirmed a warning in any one of the first to third modes checks whether the operator himself or herself or another object constitutes an obstacle that interrupts the operation of mobile robot 50 and performs a countermeasure of removing the obstacle such as moving himself or herself or removing another object. In the present embodiment, in light emitting sections 40 and display operation sections 26, only light emitting sections 40 and display operation sections 26 that are located in the positions corresponding to the current position and monitoring region S of mobile robot 50 issue warnings. Due to this, the operator can become aware of the region where the presence of an obstacle is to be checked by identifying light emitting section 40 and display operation section 26 that are issuing the warning. In the present embodiment, in the third mode, display operation section 76 of mobile terminal 70 also issues a warning. Therefore, as compared with a case where the warning is issued only from light emitting section 40 and display operation section 26, the operator holding mobile terminal 70 can easily notice the warning.

Here, the correspondence relationship between the constituent elements of the present embodiment and constituent elements of the present disclosure will be clarified. Mounting machine 20 of the present embodiment corresponds to a mounting machine of the present disclosure, mounting line 11 corresponds to a mounting line, mobile robot 50 corresponds to a supply device, and light emitting section 40, display operation section 26, and display operation section 76 corresponds to a reporting section. Further, management control section 88 executing step S110, 120, S180 to S240 of the work control process in FIG. 4 corresponds to a reporting control section, surrounding environment monitoring sensor 55 corresponds to a monitoring sensor, and memory section 89 corresponds to a memory section.

In mounting system 10 described in detail above, when no feeder 30 is supplied to mounting machine 20 by mobile robot 50, at least light emitting sections 40 and display operation sections 26 issue a warning. As a result, with this mounting system 10, the operator can be encouraged to take an appropriate action such as removing the cause for the not being able to supply feeder 30 (for example, an obstacle that interrupts the operation of mobile robot 50). Therefore, in mounting system 10, the problematic state in which no feeder 30 is supplied to mounting machines 20 is easily solved at an early stage, thereby making it possible to prevent the reduction of the operating rate of mounting line 11. Additionally, in this mounting system 10, when management control section 88 performs the determination process in step S200, thereby determining from the determination process that no feeder 30 is supplied to mounting machine 20 (here, when remaining margin time Tr is smaller than first threshold T1 in step S200), management control section 88 causes at least light emitting sections 40 and display operation sections 26 to issue a warning.

In addition, management control section 88 acquires a scheduled work time in step 120, and in step S200, management control section 88 determines whether the work is performed by the scheduled work time by determining whether remaining margin time Tr derived based on the scheduled wok time is smaller than the value 0, and determines based on the determination whether feeders 30 are supplied to mounting machines 20. Then, when it is determined based on the determination made above that no feeder 30 is supplied to mounting machines 20 (here, when remaining margin time Tr is smaller than third threshold T3, that is, smaller than the value 0), management control section 88 causes light emitting sections 40, display operation sections 26, and display operation section 76 to issue a warning in the third mode. Therefore, management control section 88 can properly determine whether feeders 30 are supplied to mounting machines 20 based on the scheduled work time.

Further, when it is determined that the work will not be performed by the scheduled work time (here, when remaining margin time Tr is less than the value 0), management control section 88 causes display operation sections 26 to issue the delay time from the scheduled work time. Therefore, with this mounting system 10, since the operator can be reported of the magnitude of a reduction in the operating rate of mounting line 11 by the length of the delay time, the operator can become aware of the state of mounting line 11 in greater detail.

Furthermore, management control section 88 acquires a scheduled work time in step 120, determines whether the work is performed a predetermined period of time (here, five minutes) before the scheduled work time based on remaining margin time Tr that is derived based on the scheduled work time and threshold T2 in step S200, and determines based on the determination made above whether feeders 30 are supplied to mounting machines 20. Then, when it determines from the determination made above that no feeder 30 is supplied to mounting machines 20, management control section 88 causes light emitting sections 40 and display operation sections 26 to issue a warning in the first mode. Due to this, mounting system 10 reports the operator of the warning at least a predetermined period of time earlier than a timing at which the work cannot be performed by the scheduled work time (i.e., a timing at which remaining margin time Tr becomes smaller than the value 0). As a result, in the case where the operator takes an appropriate action within the predetermined period of time, a halt of mounting line 11 can be avoided. Therefore, with mounting system 10, the reduction in operating rate of mounting line 11 can be reduced further.

Then, when it determines that the work cannot be performed the predetermined time before the scheduled work time, management control section 88 causes display operation sections 26 to display thereon remaining margin time Tr, which is a remaining time allowing the work to be performed at the scheduled work time (steps S210, S220). This enables the operator to judge the level of urgency at which the operator has to take a countermeasure from the length of remaining margin time Tr. For example, the operator can determine based on the length of reported remaining margin time Tr whether the operator is in a status where mounting line 11 can be prevented from being stopped even though the cause of the operation stop of mobile robot 50 is removed after the completion of work the operator is now performing or in a status where mounting line 11 is stopped unless the operator suspends the work the operator is now performing to remove the cause of the operation stop of mobile robot 50. Therefore, with this mounting system 10, the operator can be prompted to take a more appropriate action.

Further, when the state where management control section 88 determines that no feeder 30 is supplied to mounting machines 20 (here, the state where remaining margin time Tr is smaller than first threshold T1 in step S200) continues, management control section 88 causes at least one of light emitting section 40, display operation section 26, and display operation section 76 to issue a warning such that the longer the state continues (here, the shorter remaining margin time Tr gets), the stronger the warning gets. More specifically, management control section 88 causes light emitting section 40 to emit yellow light before remaining margin time Tr becomes smaller than second threshold T2 and changes the color of light emitted from light emitting section 40 to red representing a stronger warning after remaining margin time Tr becomes smaller than second threshold T2 but equal to or greater than third threshold T3. In addition, after remaining margin time Tr becomes smaller than third threshold value T3, management control section 88 causes also display operation section 76 to issue a warning in addition to light emitting section 40 and display operation section 26. As a result, with this mounting system 10, since as the continuation time of the state where no feeder 30 is supplied to mounting machines 20 gets longer, the operator can be prompted to take an appropriate countermeasure action in an earlier stage, the halt of mounting line 11 can be prevented from continuing for a long time. In addition, the operator can determine the level of urgency at which the operator has to take a countermeasure action by recognizing the level of urgency in the first to third modes.

The present disclosure is not limited in any way to the embodiment described heretofore, and hence, needless to say, the present disclosure can be carried out in various modes without departing from the technical scope thereof.

Figure 5:
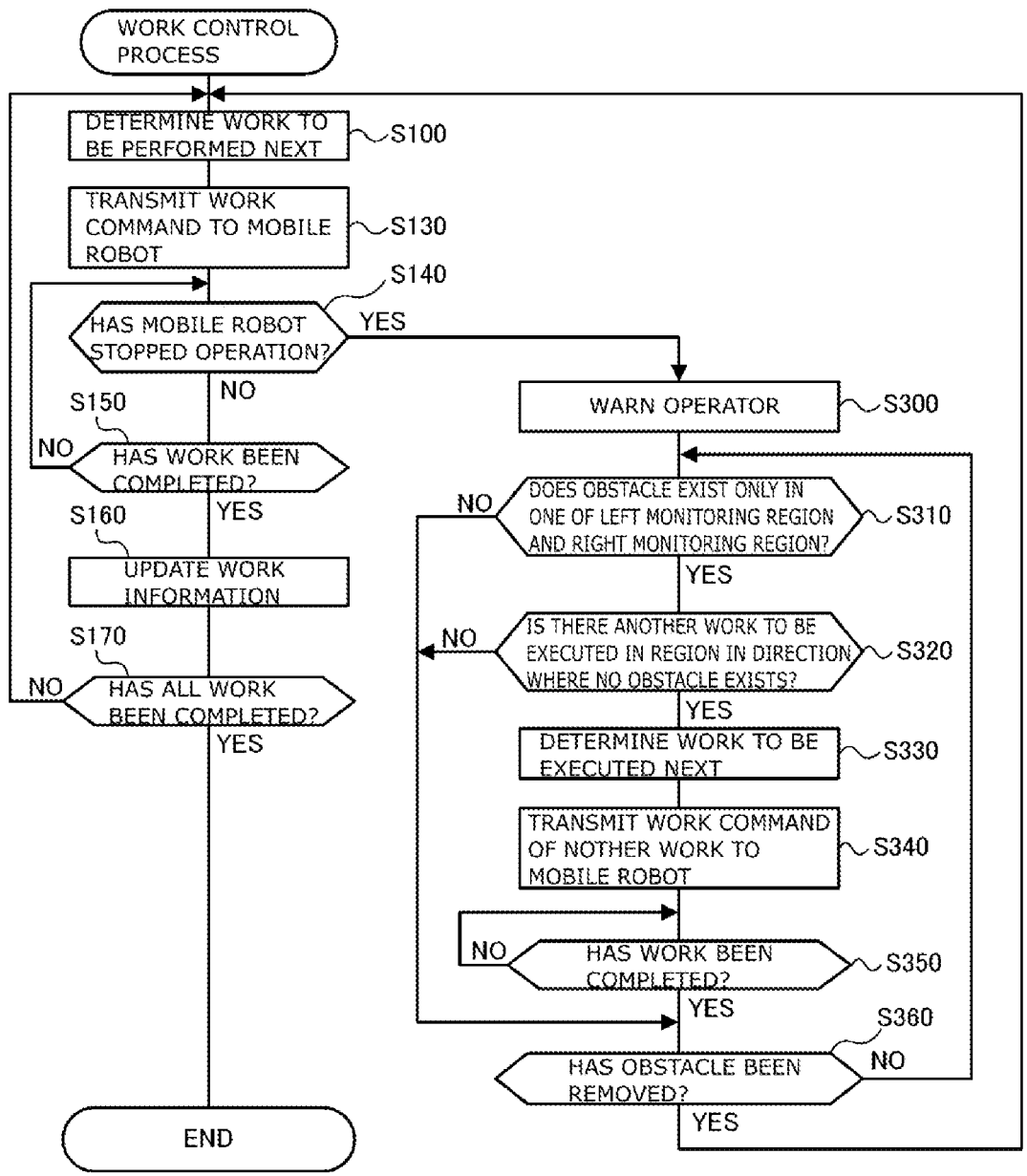
FIG. 5 is a flow chart of a work control process of a modified example.

For example, in the embodiment described above, while an obstacle is detected in monitoring region S, mobile robot 50 stops its operation until the obstacle is removed, mobile robot 50 may perform work from time to time even though an obstacle is detected. FIG. 5 is a flow chart showing an example of a work control process of a modification example to handle the case described above. In the work control process shown in FIG. 5, like step numbers will be given to like processes to those of the work control process shown in FIG. 4, and detailed description thereof will be omitted here. In this modified example, when mobile robot 50 is loading or unloading feeders 30, robot control section 58 causes mobile robot 50 to continue loading or unloading feeders 30 even though an obstacle is detected in monitoring region S and also does not transmit an operation stop signal. That is, when an obstacle is detected in the monitoring region S, robot control section 58 stops mobile robot 50 only from traveling. In the work control process according to the modified example shown in FIG. 5, when management control section 88 receives an operation stop signal from robot control section 58 in step S140 and determines that mobile robot 50 has stopped operating (i.e., stopped traveling), management control section 88 issues a warning (step S300). The warning may be in any of the modes in steps S210 to S230 in FIG. 4. Management control section 88 may continue to issue the warning until it determines in step S360, which will be described later, that the obstacle is removed. In addition, similar to the embodiment described above, the warning may be issued in different modes depending on the length of the stop time. Next, management control section 88 determines whether the obstacle detected by surrounding environment monitoring sensor 55 is in only one of left and right monitoring regions Sa, Sb (step S310). Management control section 88 acquires, for example, detection states of left and right monitoring sensors 55a, 55b from robot control section 58 and makes a determination. When the obstacle is in only one of left and right monitoring regions Sa, Sb, management control section 88 determines whether there is another executable work in the region where no obstacle exists in the arrangement direction of mounting line 11 with respect to the position of mobile robot 50 (step S320). In step S320, management control section 88 first acquires the current position of mobile robot 50, and specifies a device in mounting line 11 that resides in a region where mobile robot 50 can move without being interrupted by the obstacle based on the acquired current position, information on which of left and right monitoring sensors 55a, 55b does not detect the obstacle, and device position information 89a. Then, management control section 88 makes the determination in step S320 based on whether work information 89d includes incomplete work for which the specified device is designated as a work target device and whether mobile robot 50 is ready to execute the work. For example, in the case where the work type of the work in question is "supply", whether mobile robot 50 is ready to execute the work means whether supply target feeders 30 have already been accommodated in robot transfer area 50A. In addition, in the case where the work type of the work in question is "collection", whether mobile robot 50 is ready to execute the work means whether there exists in robot transfer area 50A a vacant space to accommodate supply target feeders 30. Management control section 88 determines whether mobile robot 50 is ready to execute the work based on, for example, feeder holding information 89c. Management control section 88 may change the slot numbers of mobile robot 50 that are included in the work content information of work information 89d as required. For example, assuming that the work on the work sequence from "001" to "004" in FIG. 3 is completed, and mobile robot 50 stops traveling as a result of only left monitoring sensor 55a detecting an obstacle in the midst of mobile robot 50 traveling to the left from the state in FIG. 1 toward the left adjacent mounting machine 20 as the work next in the work sequence at "005". In this case, management control section 88 identifies, in mounting line 11, four mounting machines 20 from the right, which are devices on the right side of the current position of mobile robot 50, as residing in a region where mobile robot 50 can travel. Then, management control section 88 studies work information 89*d*, and specifies the work at "006" and "007" in the work sequence as incomplete work performed on any one of the multiple specified devices (here, mounting machines 20 whose target position information is in a range from "02" to "05") as the work target device. Then, in case mobile robot 50 is ready to execute at least any of the work described above, management control section 88 makes an affirmative determination in step S320. If it is determined in step S320 that there is another executable work, management control section 88 sets the other work as work to be performed next (step S330) and transmits a work command for the work to mobile robot 50 (step S340). When there are multiple different pieces of work that can be executed, management control section 88 may set a piece of work, among the pieces of work, of the earliest work sequence as "work to be executed next" in step S330. Then, management control section 88 waits until mobile robot 50 completes the work (step S350). When it is determined in step S310 that an obstacle is in both the left and right monitoring regions Sa, Sb, when it is determined in step S320 that there is no other work to be executed, or when it is determined in step S350 that the work is completed, management control section 88 determines whether the obstacle has been removed (step S360). For example, when the operator confirms the warning in step S300 and removes the obstacle, the operator operates at least any one of display operation sections 26, 56, 76 or display 86 to input information informing that the obstacle has been removed, and management control section 88 acquires an obstacle removal signal to that respect. In step S360, management control section 88 makes a determination in step S360 based on whether the obstacle removal signal has been acquired. Then, if it is determined in step S360 that the obstacle has not yet been removed, management control section 88 executes the processes from step S310 on. That is, in the case where there is another work to be executed without being interrupted by the obstacle, management control section 88 causes mobile robot 50 to execute the work until the obstacle is removed. Additionally, in the case where there exists no other work to be executed without being interrupted by the obstacle, or in the case where an obstacle is in both the left and right monitoring regions Sa, Sb, preventing mobile robot 50 from traveling, management control section 88 waits for the obstacle to be removed. On the other hand, if it is determined in step S360 that the obstacle has been removed, management control section 88 executes the processes from step S100 on. That is, management control section 88 sets, among incomplete pieces of work stored in work information 89*d*, a piece of work of the earliest work sequence as "work to be executed next" and causes mobile robot 50 to execute the incomplete pieces of work according to the work sequence. In this way, according to the work control process of the modified example, in the case where mobile robot 50 is not caused to stop operation by an obstacle, management control section 88 causes mobile robot 50 to perform the work according to the work sequence of work information 89*d*. On the other hand, in the case where mobile robot 50 is caused to stop operation by an obstacle, when there is another work to be executed before the operator removes the obstacle, management control section 88 causes mobile robot 50 to first execute the work although the work sequence is not followed properly. Due to this, with mounting system 10 according to the modified example, the operating rate of mounting line 11 can be prevented from being reduced further even though the obstacle is not removed immediately. In case mobile robot 50 is caused to stop operation by an obstacle while waiting for the work to be completed in step S350, management control section 88 may wait for the obstacle to be removed in step S360.

In the embodiment described above, when a warning stop operation is inputted from the operator via display operation section 26, from this point in time on, management control section 88 may issue no warning in steps S210 to S230 and wait until it determines in step S240 that the operation stop of mobile robot 50 is canceled. As a result, once he or she confirms the warning, the operator can stop the warning arbitrarily.

In the embodiment described above, one work corresponding to one work sequence includes the traveling of mobile robot 50 and the supply or collection of feeders 30 by mobile robot 50; however, the present disclosure is not limited to this configuration. For example, the conveying of feeders 30 and the supplying of feeders 30 that are performed by mobile robot 50 may be included in work information 89*d* as separate pieces of work. In this case, scheduled work times may be determined individually for the work of conveying feeders 30 and the work of supplying feeders 30.

In the embodiment described above, the scheduled work time is set for all the work included in work information 89*d*, but the present disclosure is not limited thereto. For example, the scheduled work time may be set for work including at least one of the conveying of feeders 30 and the supplying of feeders 30 to mounting machines 20 that are performed by mobile robot 50. At this time, for example, in the case where no scheduled work time is associated with the work determined in step S100, management control section 88 may identify incomplete work having a closest work sequence to the work determined in step S100 in the work with which scheduled work times are associated and perform the processes in steps S110, S120, S190 on the identified work.

In the embodiment described above, the scheduled work time is the time at which the work specified by the corresponding work content information should be completed, but the present disclosure is not limited thereto, and hence, the scheduled work time may be, for example, a time at which work should be started, or a time at which mobile robot 50 should arrive at the position of a work target device. For example, similarly to the modified example described in FIG. 5, in the case where mobile robot 50 stops only traveling without stopping loading or unloading feeders 30 when an obstacle is detected in monitoring region S, feeders 30 are supplied or collected without stopping when mobile robot 50 arrives at the position of a work target device. In such a case, the scheduled work time may be referred to as a time at which mobile robot 50 should arrive at the position of the work target device, and in case mobile robot 50 arrives at the position of the work target device by the scheduled work time, feeders 30 may be regarded as being supplied or collected in time.

In the embodiment described above, management control section 88 issues the warning by using at least one of light emitting section 40, display operation section 26, and display operation section 76, but the warning may be reported by using display operation section 56 or display 86 in addition to or in place of the reporting approach described above. In addition, the reporting section for issuing a warning is not limited to the device for visually reporting the warning such as light emitting section 40 and display operation section 26, and hence, the reporting section may be a device such as a speaker for issuing a warning by sound.

In the embodiment described above, management control section 88 compares remaining margin time Tr with first to third thresholds T1 to T3 to switch between the first to third modes stepwise, but the present disclosure is not limited thereto.

Management control section 88 only needs to control at least one of the one or more reporting sections so as to issue a warning such that a stronger warning is issued as remaining margin time Tr gets shorter (the continuation time of supplying no feeder 30 gets longer). For example, management control section 88 may continuously change the modes of warning in accordance with the length of remaining margin time Tr. For example, in the case of issuing a warning by sound from a speaker, management control section 88 may continuously increase the volume of the warning as remaining margin time Tr gets shorter. In addition, the management control section 88 does not have to change the modes of warning in accordance with the length of remaining margin time Tr.

In the embodiment described above, management control section 88 issues the warning such that the warning gets stronger as the length of remaining margin time Tr gets shorter, but the present disclosure is not limited thereto. For example, management control section 88 may issue a warning such that the warning gets stronger as the stop time, which started being timed in step S180, gets longer. In this case, management control section 88 need not derive the margin time and remaining margin time Tr, and work information 89d need not include information on the scheduled work time.

In the embodiment described above, management control section 88 issues the warning although remaining margin time Tr is greater than the value 0, when remaining margin time Tr is smaller than first threshold T1, but the present disclosure is not limited thereto, and hence, management control section 88 need not issue a warning until remaining margin time Tr becomes smaller than the value 0. Alternatively, management control section 88 may issue a warning immediately by determining that no feeder 30 is supplied by mobile robot 50 when management control section 88 determines in step S140 that mobile robot has 50 stopped. In this case, management control section 88 need not derive the margin time and remaining margin time Tr, and work information 89d need not include information on the scheduled work time.

In the embodiment described above, management control section 88 causes, among light emitting sections 40 and display operation sections 26, light emitting section 40 and display operation section 26 of the device corresponding to the current position of mobile robot 50 and monitoring region S to issue a warning, but the present disclosure is not limited thereto. For example, management control section 88 may cause only light emitting unit 40 and display operation section 26 of the device corresponding to the current position of mobile robot 50 to issue a warning or may cause all light emitting sections 40 and display operation sections 26 to issue a warning. In addition, in the embodiment described above, the numbers of light emitting sections 40 and display operation sections 26 that are caused to issue a warning are the same in the first mode and the second mode, but the present disclosure is not limited thereto, and hence, the numbers of light emitting sections 40 and display operation sections 26 may be greater in the second mode than in the first mode.

In the embodiment described above, an obstacle is raised as a cause by which mobile robot 50 stops operation, but the present disclosure is not limited thereto, and hence, a failure of mobile robot 50 is can also be raised as a cause.

In the embodiment described above, the member conveyed and supplied by mobile robot 50 is referred to as feeder 30, but the present disclosure is not limited thereto, and hence, any member may be so conveyed and supplied as long as the member is used in mounting machines 20 of mounting line 11. For example, mobile robot 50 may convey suction nozzles for supplying to mounting machines 20.

Figure 6:
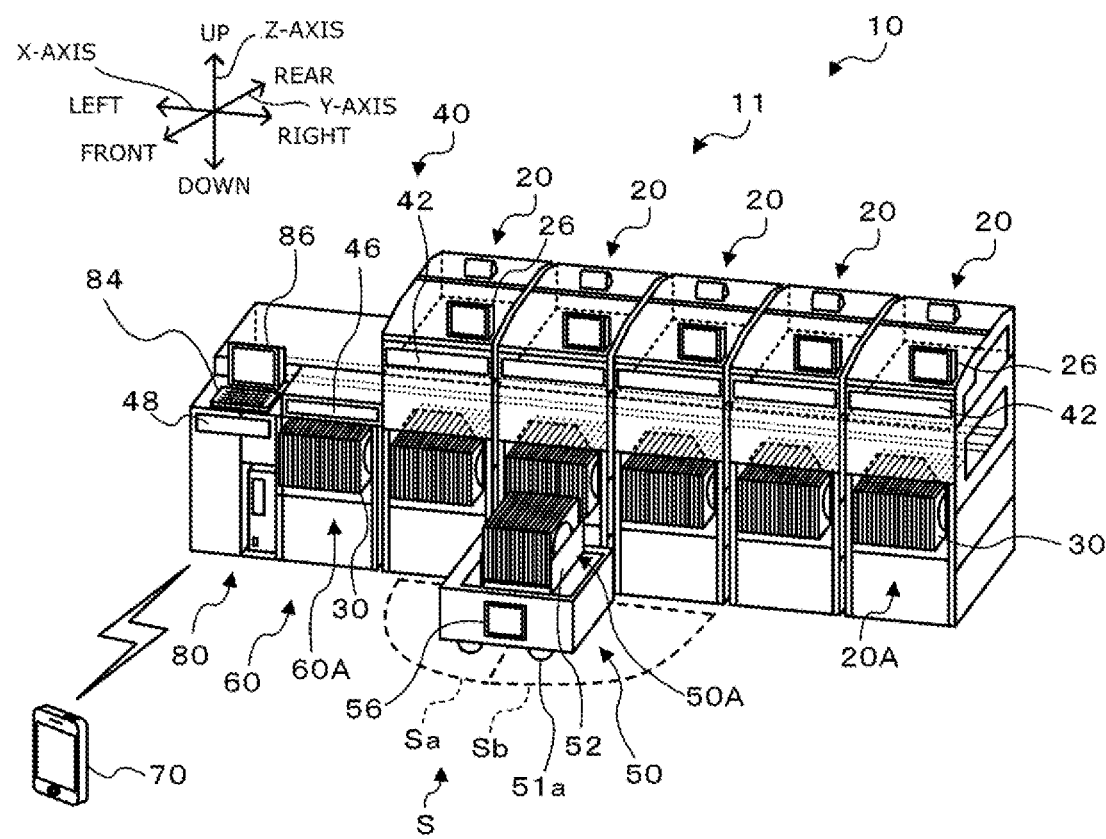
FIG. 6 is a diagram showing a schematic configuration of mounting system 10 provided with mobile robot 50 of the modified example.

In the embodiment described above, mounting system 10 includes X-axis rail 18 disposed on the front surfaces of multiple mounting machines 20 that are perpendicular to the arrangement direction and the up-down direction along the arrangement direction, and mobile robot 50 travels along the X-axis rail 18, but the present disclosure is not limited thereto, and hence, mobile robot 50 need only be able to travel in the arrangement direction. For example, as shown in FIG. 6, mobile robot 50 may be an AGV that travels on wheels 51a. In this case, mounting system 10 does not need to include X-axis rail 18. In mobile robot 50 of a modified example shown in FIG. 6, robot moving mechanism 51 drives wheels 51a to cause mobile robot 50 to travel in the arrangement direction. Mobile robot 50 may be able to travel not only in the arrangement direction (here, in the left-right direction) but also in the front-rear direction. In this mobile robot 50, robot transfer area 50A and feeder transfer mechanism 52 are provided on the housing of mobile robot 50.

In the embodiment described above, mobile robot 50 includes encoder 53, but mobile robot 50 may include a position sensor in addition to or in place of encoder 53. In particular, when mobile robot 50 is an AGV, mobile robot 50 preferably includes a position sensor. The position sensor is a sensor for detecting the position of mobile robot 50, and may also be able to detect the direction (rotation) of mobile robot 50. Examples of position sensors include GPS sensors, gyro sensors, geomagnetic sensors, acceleration sensors, and the like, and mobile robot 50 may include one or more of these sensors as position sensors. Management control section 88 may acquire the position information of mobile robot 50 detected by the position sensor from robot control section 58.

The mounting system and the display control device of the present disclosure may be configured as follows.

The mounting system of the present disclosure may include a reporting control section configured to perform a determination process for determining whether the member is supplied to the mounting machine by the supply device and cause the reporting section to report the warning when it determines through the determination process that the member is not supplied.

In the mounting system of the present disclosure, the reporting control section may acquire a work scheduled time of work including at least one of conveying the member and supplying the member to the mounting machine that are performed by the supply device and may determine whether the member is supplied based on whether the work is performed by the work scheduled time in the determination process. As a result, the reporting control section can appropriately determine whether the member is supplied based on the scheduled work time.

Here, "the work is performed by the scheduled work time" may be construed as such that the work is started by the scheduled work time, or may be construed as such that the work is completed by the scheduled work time.

In the mounting system of the present disclosure, when it is determined that the work will not be performed by the scheduled work time, the reporting control section may cause the reporting section to issue a delay time from the scheduled work time. As a result, since the mounting system can report the operator of the magnitude of a decrease in the operating rate of the mounting line by the length of the delay time, the operator can become aware of the state of the mounting line in greater detail.

In the mounting system of the present disclosure, the reporting control section may acquire a scheduled work time of work including at least one of conveying the member and supplying the member to the mounting machine that are performed by the supply device, and may determine whether the member is supplied based on whether the work is performed by a predetermined time before the scheduled work time in the determination process. As a result, since this mounting system issues the warning at least the predetermined time earlier than the timing at which the work will not be performed by the scheduled work time, the halt of the mounting line can be avoided as long as the operator takes an appropriate countermeasure action within the predetermined time. As a result, with this mounting system, a decrease in operating rate of the mounting line can further be reduced.

In this case, when the reporting control section determines that the work will not be performed by the predetermined time before the scheduled work time, the reporting control section may cause the remaining time for enabling the work to be performed at the scheduled work time to be reported from the reporting section. As a result, the operator can judge the level of urgency at which the operator takes a countermeasure action based on the length of the remaining time. Thus, with this mounting system, the operator can be prompted to take a more appropriate action.

The mounting system of the present disclosure may have one or more reporting sections, and when a state where the member is determined not to be supplied continues in the determination process, the reporting control section may cause at least one of the reporting sections to issue a warning such that the warning gets stronger as the continuation time of the state gets longer. As a result, with this mounting system, since the operator can be prompted to take a countermeasure action earlier as the continuation time of the state where no member is supplied gets longer, the stopping period of the mounting line can be prevented from being extended longer. Here, "the warning gets stronger as the continuation time of the state gets longer" includes both a case where the intensity of the warning is caused to change continuously in accordance with the length of the continuation time and a case where the intensity of the warning is caused to change stepwise in accordance with the length of the continuation time. In addition, the reporting control section may change the intensity of the warning by changing warning modes within the same reporting section; may change the intensity of the warning by changing the reporting section, among multiple reporting sections, made to issue warnings; or may change the intensity of the warning by changing the number of reporting sections, among multiple reporting sections, made to issue warnings.

In this case, the reporting control section may cause at least one of the reporting sections to issue a stronger warning after the continuation time exceeds a threshold than before the continuation time exceeds the threshold.

In the mounting system of the present disclosure, the supply device may have a monitoring sensor configured to detect individually an obstacle in a first monitoring region on a first side and an obstacle in a second monitoring region on a second side of the arrangement direction with respect to the supply device and may include a memory section configured to store work information including multiple pieces of information in which contents of work including at least one of conveying the member and supplying the member to the mounting machine that are performed by the supply device, positional information of a work target device assigned to perform the work in the multiple mounting devices, and a work sequence in which the work is performed are associated with one another, and a work control section configured to cause the supply device to perform the incomplete work by following the work sequence based on the work information, and, when the incomplete work is included in the work information, the work being associated with the positional information of the work target device situated on a monitoring region side where the obstacle is not detected in the arrangement direction with respect to the supply device, the work control section causes the supply device to perform the work by permitting the supply device to deviate from the work sequence. As a result, in the case where there is work that can be executed before the operator removes the obstacle, the supply device first performs the work although the work is not proceeding according to the work sequence. As a result, with this mounting system, even though the obstacle is not removed immediately, the operating rate of the mounting line can be prevented from being reduced further.

The mounting system of the present disclosure may include a rail disposed along the arrangement direction, and the supply device may travel along the rail in the arrangement direction.

In the mounting system of the present disclosure, the supply device may travel on a wheel in the arrangement direction.

In the reporting control device of the present disclosure, the various forms of the mounting system of the present disclosure described above may be adopted, and a configuration for realizing each function of the mounting system of the present disclosure described above may be added.

INDUSTRIAL APPLICABILITY

The present disclosure can be applied to the manufacturing industry of mounting lines and the like.

REFERENCE SIGNS LIST

10 mounting system, 11 mounting line, 18 X-axis rail, 20 mounting machine, 20A supply area, 21 substrate conveyance device, 22 head, 23 head moving mechanism, 24 connector, 25 robot detection sensor, 26 display operation section, 28 mounting control section, 29 memory section, 30 feeder, 40, 42, 46, 48 light emitting section, 50 mobile robot, 50A robot transfer area, 51 robot moving mechanism, 51 wheel, 52 feeder transfer mechanism, 53 encoder, 55 surrounding environment monitoring sensor, 55a left monitoring sensor, 55b right monitoring sensor, 56 display operation section 58 robot control section 59 memory section, 60 feeder storage container, 60A storage area, 64 connector, 65 robot detection sensor, 70 mobile terminal, 76 display operation section, 78 terminal control section, 79 memory section, 80 management device, 84 input device, 86 display, 88 management control section, 89 memory section, 89a device position information, 89b production program, 89c feeder holding information, 89d work information, 89e monitoring region information, S monitoring region, Sa left monitoring region, Sb right monitoring region.

The invention claimed is:

1. A mounting system comprising:
a mounting line comprising multiple mounting machines for mounting a component on a board that are aligned side by side in an arrangement direction;
a supply device configured to move in the arrangement direction to convey a member for use in the mounting machines and supply the mounting machines with the member;
a reporting section configured to issue a warning when the member is not supplied to the mounting machines by the supply device; and
a reporting control section configured to perform a determination process for determining whether the member is supplied to the mounting machine by the supply device and cause the reporting section to issue a warning when it determines through the determination process that the member is not supplied,
wherein the reporting control section acquires a work scheduled time of work including at least one of conveying the member and supplying the member to the mounting machine that are performed by the supply device and determines whether the member is supplied based on whether the work is performed by the work scheduled time in the determination process.

2. The mounting system according to claim 1,
wherein when the reporting control section determines that the work will not be performed by the work scheduled time, the reporting control section causes the reporting section to issue a delay time from the work scheduled time.

3. The mounting system according to claim 1,
wherein the reporting control section acquires a scheduled work time of work including at least one of conveying the member and supplying the member to the mounting machines that are performed by the supply device, and determines whether the member is supplied based on whether the work is performed by a predetermined time before the work scheduled time in the determination process.

4. The mounting system according to claim 3,
wherein, when the reporting control section determines that the work will not be performed by the predetermined time before the work scheduled time, the reporting control section causes a remaining time for enabling the work to be performed at the work scheduled time to be reported from the reporting section.

5. The mounting system according to claim 1,
wherein one or more reporting sections exist, and
wherein, when a state where the member is determined not to be supplied continues in the determination process, the reporting section causes at least one of the reporting sections to issue a warning such that the warning gets stronger as a continuation time of the state gets longer.

6. The mounting system according to claim 1,
wherein the supply device has:
a monitoring sensor configured to detect individually an obstacle in a first monitoring region on a first side and an obstacle in a second monitoring region on a second side of the arrangement direction with respect to the supply device, and comprising:
a memory section configured to store work information including multiple pieces of information in which contents of work including at least one of conveying the member and supplying the member to the mounting machines that are performed by the supply device, positional information of a work target device assigned to perform the work in the multiple mounting machines, and an order in which the work is performed are associated with one another; and
a work control section configured to cause the supply device to perform incomplete work by following a work sequence based on the work information, and, when the incomplete work is included in the work information, the work being associated with the positional information of the work target device situated on a monitoring region side where the obstacle is not detected in the arrangement direction with respect to the supply device, the work control section causes the supply device to perform the work by permitting the supply device to deviate from the work sequence.

7. The mounting system according to claim 1, comprising:
a rail disposed along the arrangement direction,
wherein the supply device travels along the rail in the arrangement direction.

8. The mounting system according to claim 1,
wherein the supply device travels on a wheel in the arrangement direction.

* * * * *